(12) United States Patent
Zhang et al.

(10) Patent No.: US 11,102,896 B1
(45) Date of Patent: Aug. 24, 2021

(54) ANTI-IMPACT LED DISPLAY SCREEN

(71) Applicant: SHENZHEN GLOSHINE TECHNOLOGY CO., LTD., Guangdong (CN)

(72) Inventors: Xianfeng Zhang, Guangdong (CN); Yongjun Zhang, Guangdong (CN); Guoqiang Li, Guangdong (CN); Zhiqiang Gao, Guangdong (CN)

(73) Assignee: SHENZHEN GLOSHINE TECHNOLOGY CO., LTD., Shenzhen (CN)

( * ) Notice: Subject to any disclaimer, the term of this patent is extended or adjusted under 35 U.S.C. 154(b) by 301 days.

(21) Appl. No.: 16/476,549

(22) PCT Filed: Apr. 29, 2019

(86) PCT No.: PCT/CN2019/084918
§ 371 (c)(1),
(2) Date: Jul. 8, 2019

(87) PCT Pub. No.: WO2020/164191
PCT Pub. Date: Aug. 20, 2020

(30) Foreign Application Priority Data

Feb. 15, 2019 (CN) .......................... 201910116014.2

(51) Int. Cl.
*H05K 5/02* (2006.01)
*H05K 5/00* (2006.01)
*H05K 1/18* (2006.01)

(52) U.S. Cl.
CPC ......... *H05K 5/0217* (2013.01); *H05K 5/0017* (2013.01); *H05K 1/18* (2013.01); *H05K 5/0021* (2013.01); *H05K 2201/10106* (2013.01)

(58) Field of Classification Search
CPC .. H05K 5/0217; H05K 5/0017; H05K 5/0021; H05K 2201/10106; H05K 1/18;
(Continued)

(56) References Cited

U.S. PATENT DOCUMENTS 7,059,182 B1 * 6/2006 Ragner ................ H05K 5/0086
73/200
8,305,744 B2 * 11/2012 Shedletsky .......... H05K 5/0017
361/679.21

(Continued)

*Primary Examiner* — Abhishek M Rathod

(57) ABSTRACT

Provided is an anti-impact LED display screen, comprising a box body (1), a module (2), a protective mechanism (3), a first resilient assembly (4), a second resilient assembly (5) and a limit member (6). The protective mechanism (3) comprises a movable base (31) and a corner armor (32). The corner of box body (1) is provided with a groove (11) for accommodating protective mechanism (3), the first resilient assembly (4) is arranged between corner armor (32) and movable base (31); The second residual assembly (5) is arranged between the side wall of groove (11) and protective mechanism (3); When protective mechanism (3) is turned on, the second resilient assembly (5) pushes protective mechanism (3) to move outward of groove (11), and the first resilient assembly (4) pushes the corner armor (32) out of groove (11), corner armor (32) can protect module (2); when reset, the upper end of corner armor (32) abuts against the upper wall of groove (11), limit member (6) limits protective mechanism (3) within groove (11), protective mechanism (3) does not affect the splicing of LED display screens.

15 Claims, 3 Drawing Sheets

(58) Field of Classification Search
CPC . H04M 1/185; H04M 2250/12; G06F 1/1656; G06F 1/1626; F16F 2230/0023
See application file for complete search history.

(56) References Cited

U.S. PATENT DOCUMENTS

| | | | | |
|---|---|---|---|---|
| 8,421,763 | B2* | 4/2013 | Liao | H04M 1/185 345/173 |
| 8,430,381 | B2* | 4/2013 | Chen | G06F 1/1601 267/140 |
| 8,804,948 | B2* | 8/2014 | Lee | G06F 1/1684 379/437 |
| 10,306,030 | B1* | 5/2019 | Zeng | H04B 1/3888 |
| 10,715,645 | B2* | 7/2020 | Wilson | H04B 1/3888 |
| 2010/0164152 | A1* | 7/2010 | Li | H04M 1/185 267/140.15 |
| 2011/0194230 | A1* | 8/2011 | Hart | H04M 1/185 361/437 |
| 2013/0257582 | A1* | 10/2013 | Rothkopf | G06F 1/1656 340/3.1 |
| 2014/0133072 | A1* | 5/2014 | Xiaozhuo | G06F 1/1656 361/679.01 |
| 2015/0301565 | A1* | 10/2015 | Manullang | G06F 1/1637 361/679.26 |
| 2015/0331456 | A1* | 11/2015 | Moon | H04M 1/185 361/51 |
| 2015/0341070 | A1* | 11/2015 | Sanford | H04M 1/0202 455/575.8 |
| 2017/0111076 | A1* | 4/2017 | Choi | H04B 1/3888 |
| 2017/0355507 | A1* | 12/2017 | Rivellini | H01F 7/122 |
| 2018/0295731 | A1* | 10/2018 | Burdoucci | H04M 1/185 |
| 2019/0059542 | A1* | 2/2019 | Mukherjee | H04B 1/3888 |
| 2019/0165825 | A1* | 5/2019 | Lin | H04B 1/3888 |

* cited by examiner

ANTI-IMPACT LED DISPLAY SCREEN

TECHNICAL FIELD

The application belongs to the technical field of protective support equipment, in particular to an anti-impact LED display screen.

BACKGROUND

LED display screen is a flat panel display, which is a device used to display text, images, video and video recording signals and other information. Because LED display screen can be arbitrarily extended, seamlessly spliced, and its running time is long, interactive technology can be applied and the display effect is good, it is widely used in airports, shopping malls, hotels, high-speed rail, subways, cinemas, exhibitions, office buildings and other places.

At present, the structure of LED display screen is that the module is installed on the box body, for splicing at later period, the edge of the module is beyond the edge of the box body by a certain distance or is flush with the box body, because the lamp beads on the edge of the module have no protection, and the lamp beads welded on the circuit board will fall under the action of small external force, which could cause damage to the whole product. Furthermore, the LED display screen is directly placed on a transport frame paved with foam when transported in factory, the four corners are not effectively protected, which increases the probability of dropping the lamp beads at the four corners of the LED display screen during the transportation process. In the transportation process, foam is mostly used to directly protect the LED display screen, however, the friction between foam and the corners of the LED display screen could also increase the probability of dropping the lamp beads.

It can be seen that the structure of the conventional LED display screen and the fixing method of the lamp beads easily lead to damage of the lamp beads on the module. The foam protection applied in the transportation process only protects the surface of the LED display screen. The box body of the LED display screen, and the four corners of the module that easily drop the lamp beads are not protected, during operation, the four corners of the lamp beads can be easily knocked off, thus damaging the whole lamp panel.

Technical Problem

The technical problem to be solved by the application is to provide an anti-impact LED display screen aiming at the technical problem that a module is easy to be damaged in the prior Art.

Technical Solution

The technical solution adopted by the application for solving the above technical problem is as follows: providing an anti-impact LED display screen, comprising a box body and a module fixed on the box body, a protective mechanism, a first resilient assembly, a second resilient assembly and a limit member. The protective mechanism comprises a movable base and a corner armor. The corner of the box body is provided with a groove for accommodating the protective mechanism, and the first resilient assembly is arranged between the corner armor and the movable base;

The second resilient assembly is arranged between the side wall of the groove and the protective mechanism;

When the protective mechanism is turned on, the second resilient assembly pushes the protective mechanism to move outward of the groove, the first resilient assembly pushes the corner armor out of the groove, and the corner armor covers the corner of the module;

When the protective mechanism is reset, the upper end of the corner armor abuts against the upper wall of the groove, the corner armor compresses the first resilient assembly, the protective mechanism compresses the second resilient assembly, and the limit member limits the protective mechanism within the groove.

In the anti-impact LED display screen of the present application, when the limit member stops the protective mechanism in the groove, applying an external force to compress the second resilient assembly can move the protective mechanism toward the groove.

In the anti-impact LED display screen of the present application, the first resilient assembly comprises a first guide post and a first resilient member sleeved on the first guide post, one end of the first guide post is fixed on the corner armor or the movable base, the lower part of the corner armor is limited to a position between the upper end of the movable base and the upper wall of the groove, and the first resilient member is positioned between the corner armor and the movable base;

The second resilient assembly comprises a second guide post and a second resilient member sleeved on the second guide post, one end of the second guide post is fixed on the protective mechanism or the inner groove wall, the movable base is limited within the groove, and the second resilient member is positioned between the side wall of the groove and the protective mechanism.

In the anti-impact LED display screen of the present application, the first guide post is fixed on the corner armor, the movable base is provided with a first guide hole, and the first guide post can extend into the first guide hole;

The second guide post is fixed on the protective mechanism, the box body is provided with a second guide hole, and the second guide post can extend into the second guide hole.

In the anti-impact LED display screen of the present application, when the protective mechanism is turned on, the distance between the second guide post and the second guide hole is L, and the original length of the second resilient member is 1, L<1.

In the anti-impact LED display screen of the present application, both ends of the first resilient member are respectively pressed against the corner armor and the movable base;

both ends of the second resilient member are respectively pressed against the side wall of the groove and the protective mechanism.

In the anti-impact LED display screen of the present application, the end of the first guide post away from the corner armor is located in the first guide hole;

the end of the second guide post away from the protective mechanism is located in the second guide hole.

The anti-impact LED display screen of the present application, further comprises a mounting base, wherein the mounting base is fixed in the groove, a chute is arranged on the mounting base, a sliding block is arranged on the protective mechanism, and the sliding block is slidably arranged in the chute.

In the anti-impact LED display screen of the present application, the protective mechanism further comprises at least a third guide post, the third guide post is fixed on the movable base or the corner armor. At least one third guide hole is arranged on the corner armor or the movable base, the third guide post extends into the third guide hole, and the third guide posts correspond one-to-one to the third guide holes.

In the anti-impact LED display screen of the present application, the third guide post is fixed on the movable base;

the lower end of the corner armor extends inwards and has a fixed plate, the fixed plate can abut against the upper wall of the groove, the fixed plate is provided with a through hole, and the third guide post passes through the through hole.

In the anti-impact LED display screen of the present application, the limit member is arranged on the box body and telescopic;

when the protective mechanism is turned on, the protective mechanism can press the limit member into the box body;

when the protective mechanism is reset, the limit member extends out and can abut against the outer side of the protective mechanism.

In the anti-impact LED display screen of the present application, the abutting end between the limit member and the protective mechanism is a cone.

In the anti-impact LED display screen of the present application, after the protective mechanism is turned on, the limit member abuts against the inner side of the protective mechanism.

In the anti-impact LED display screen of the present application, the limit member comprises a first bump stop and a second bump stop, the first bump stop is arranged on the lower wall of the groove, and the second bump stop is arranged on the upper wall of the groove.

In the anti-impact LED display screen of the present application, when the protective mechanism is turned on, the corner armor protrudes from the upper part of the module.

Beneficial Effects

According to the anti-impact LED display screen provided by the embodiments of the application, when the protective mechanism is turned on, the second resilient assembly pushes the protective mechanism outward the groove until the corner armor can extend out of groove under the push of the first resilient assembly, and cover the corners of the module. When encountering bumps or impacts, corner armor first contacts with external objects, buffering and dispersing the bumps or impacts, and protecting the module covered by corner armor, so as to prevent the lamp beads on the module from being knocked off.

When reset, the protective mechanism is located in groove, not affecting the splicing of LED display screens.

The technical solution that the first resilient assembly and second resilient assembly push the corner armor to protect corners of the module is simple in structure, convenient to operate and good in protection effect.

BRIEF DESCRIPTION OF THE DRAWINGS

FIG. 2 is a schematic structural view of the anti-impact LED display screen provided by an embodiment of the application when it is turned on;

Figure 1:
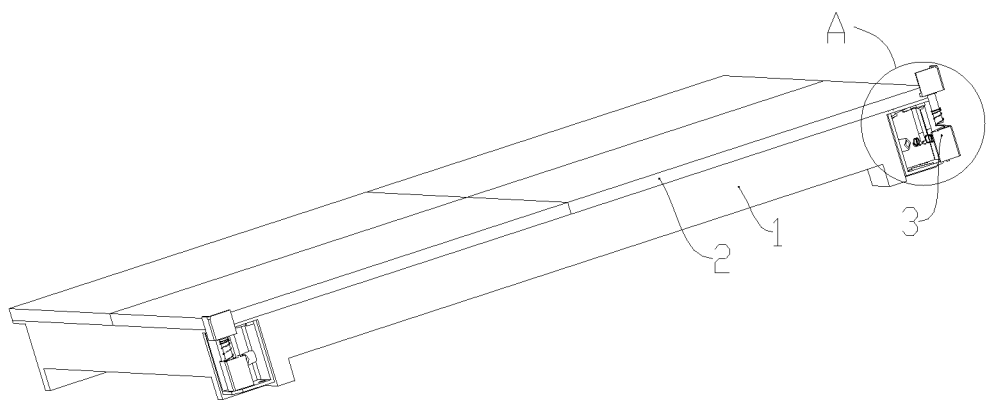
FIG. 1 is a schematic exploded view of the structure of the anti-impact LED display screen provided by an embodiment of the application.
Figure 2:
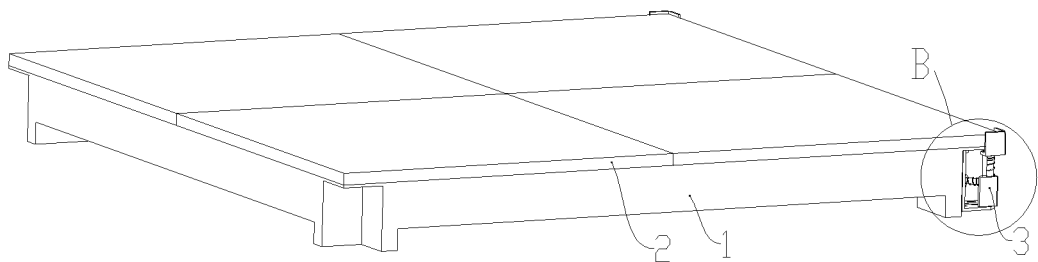

Reference numerals in the specification are as follows:

1. Box body; 11. Groove; 12. Second guide hole;
2. Module;
3. Protective mechanism; 31. Movable base; 311. First guide hole; 312. Sliding block; 32. Corner armor; 321. Fixed plate; 33. Third guide post;
4. First resilient assembly; 41. First guide post; 42. First resilient member;
5. Second resilient assembly; 51. Second guide post; 52. Second resilient member;
6. Limit member; 61. First bump stop; 62. Second bump stop;
7. Mounting base; 71. Chute.

EMBODIMENTS OF THE PRESENT APPLICATION

In order to make the technical problem to be solved, technical solutions and beneficial effects of this application clearer, the application will be described in further detail below with reference to the drawings and embodiments. It should be understood that the specific embodiments described herein are for the purpose of illustration only and not intended to limit the scope of the application.

It should be noted that when an element is referred to as being "fixed" or "arranged" on another element, it can be directly on the other element or indirectly on the other element. When an element is referred to as being "connected" to another element, it may be directly connected to the other element or indirectly connected to the other element.

It is to be understood that the terms "length", "width", "upper", "lower", "front", "rear", "left", "right", "vertical", "horizontal", "top", "bottom", "inner", "outer" and the like indicate the orientation or positional relationship based on the orientation or positional relationship shown in the drawings, only for convenience of describing the application and simplifying the description, and do not indicate or imply that the said device or element must have a specific orientation, or be constructed or operated in a specific orientation, and therefore cannot be understood as a limitation to the application.

Furthermore, the terms "first" and "second" are used for descriptive purposes only and cannot be understood as indicating or implying relative importance or implicitly indicating the number of the technical features. Thus, a feature defining "first" and "second" may explicitly or implicitly include one or more of the features. And, the singular forms "a," "an," and "the" include plural reference, unless the context clearly dictates otherwise.

Referring to FIGS. 1 to 6, the anti-impact LED display screen provided by the embodiments of the present application includes a box body 1, a module 2 fixed on the box body 1, a protective mechanism 3, a first resilient assembly 4, a second resilient assembly 5 and a limit member 6. The protective mechanism 3 comprises a movable base 31 and a corner armor 32, the corner of the box body 1 is provided with a groove 11 for accommodating the protective mechanism 3, and the first resilient assembly 4 is arranged between the corner armor 32 and the movable base 31;

The second residual assembly 5 is arranged between the side wall of the groove 11 and the protective mechanism 3;

When the protective mechanism 3 is turned on, the second resilient assembly 5 pushes the protective mechanism 3 to move outward of the groove 11, the first resilient assembly 4 pushes the corner armor 32 out of the groove 11, and the corner armor 32 covers the corner of the module 2;

When the protective mechanism 3 is reset, the upper end of the corner armor 32 abuts against the upper wall of the groove 11, the corner armor 32 compresses the first resilient assembly 4, the protective mechanism 3 compresses the second resilient assembly 5, and the limit member 6 limits the protective mechanism 3 within the groove 11.

According to the anti-impact LED display screen provided by the embodiments of the application, when the protective mechanism 3 is turned on, the second resilient assembly 5 pushes the protective mechanism 3 outward the groove 11 until the corner armor 32 can extend out of groove 11 under the push of the first resilient assembly 4, and cover the corners of the module 2. When encountering bumps or impacts, corner armor 32 first contacts with external objects, buffering and dispersing the bumps or impacts, and protecting the module 2 covered by corner armor 32, so as to prevent the lamp beads on the module 2 from being knocked off.

When reset, the protective mechanism 3 is located in groove 11, not affecting the splicing of LED display screens.

The technical solution that the first resilient assembly 4 and second resilient assembly 5 push the corner armor 32 to protect corners of the module 2 is simple in structure, convenient to operate and good in protection effect.

In this embodiment, the state of turning on the protective mechanism 3 refers to the state when the corner armor 32 covers the corner of the module 2. The state of resetting the protective mechanism 3 refers to the state when the protective mechanism 3 is located in the groove 11 and stopped by limit member 6.

Figure 3:
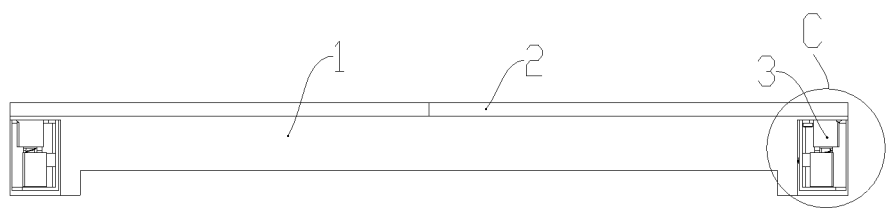
FIG. 3 is a schematic structural view of the anti-impact LED display screen provided by an embodiment of the application when it is reset.

In this embodiment, the upper, lower, left and right directions are the directions shown in FIG. 3. "Within the groove 11" refers to the part of box body 1 that is recessed inward, "out of groove 11" refers to the part of groove 11 that is located outside the surface of box body 1.

Specifically, module 2 comprises a PCB board and lamp beads arranged on the PCB board, and the side of the PCB board facing away from the lamp beads is fixed on box body 1. Module 2 also includes a front body and a rear body for protecting PCB boards and lamp beads.

Figure 6:
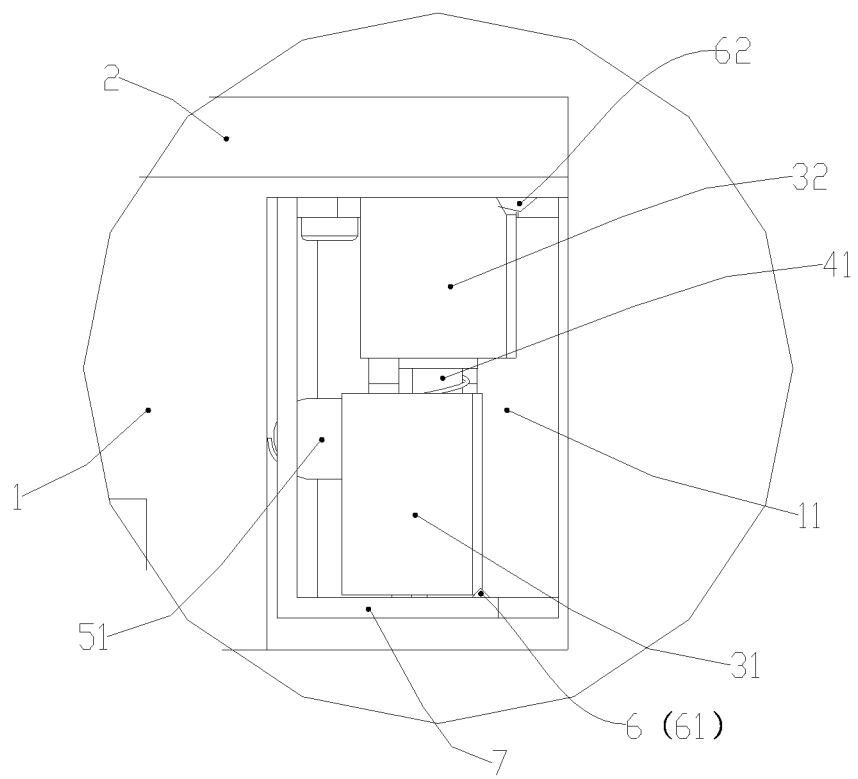
FIG. 6 is an enlarged view of C in FIG. 3.

In one embodiment, referring to FIGS. 3 and 6, when limit member 6 stops protective mechanism 3 within groove 11, applying an external force to compress second resilient assembly 5 can move the protective mechanism 3 toward groove 11. That is, after resetting the protective mechanism 3, it can continue to push the protective mechanism 3 to move toward the groove 11 so that the protective mechanism 3 can be turned on later. After resetting the protective mechanism 3 and when the protective mechanism 3 is impacted by an external force, the protective mechanism 3 continues to move toward the groove 11, which can play a buffer role.

Figure 4:
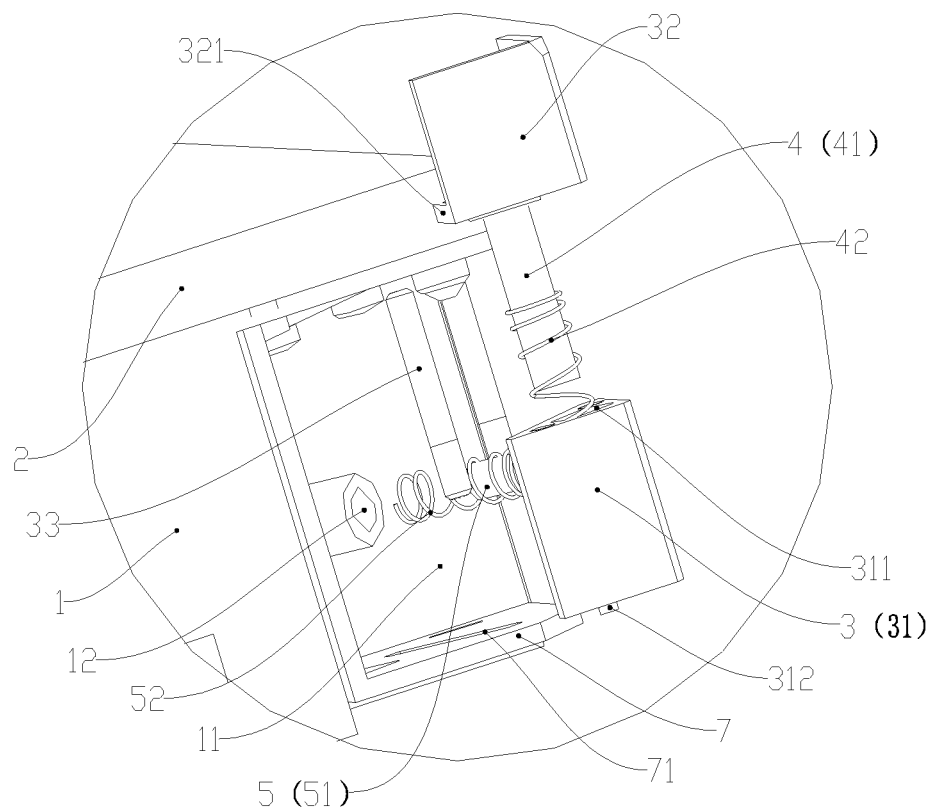
FIG. 4 is an enlarged view of A in FIG. 1.
Figure 5:
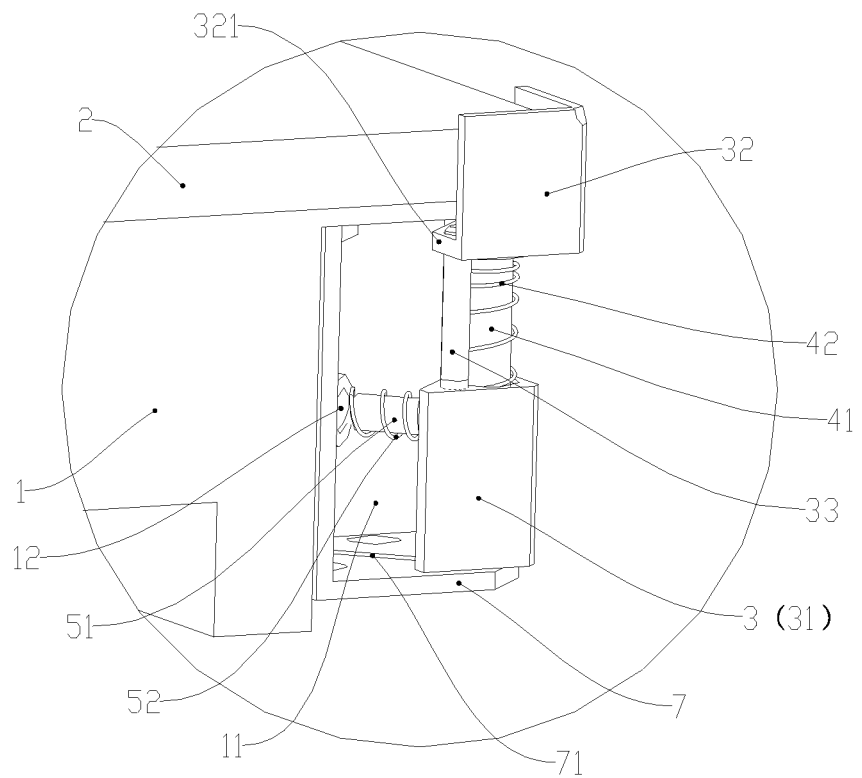
FIG. 5 is an enlarged view of B in FIG. 2.

In one embodiment, referring to FIGS. 4 and 5, the first resilient assembly 4 includes a first guide post 41 and a first resilient member 42 sleeved on the first guide post 41, one end of the first guide post 41 is fixed to the corner armor 32 or the movable base 31. The lower part of the corner armor 32 is limited to a position between the upper end of the movable base 31 and the upper wall of the groove 11, the first resilient member 42 is positioned between the corner armor 32 and the movable base 31, the first guide post 41 is used for supporting the first resilient member 42 to prevent the first resilient member 42 from tilting, bending or shifting, and the lower part of the corner armor 32 is limited to a position between the upper end of the movable base 31 and the upper wall of the groove 11, thus improving the protection effect of the corner armor 32 for the module 2, and preventing the corner armor 32 from separating from the box body 1 and falling out of the groove 11.

The second resilient assembly 5 comprises a second guide post 51 and a second resilient member 52 sleeved on the second guide post 51, one end of the second guide post 51 is fixed on the protective mechanism 3 or the inner groove 11 wall, the movable base 31 is limited within the groove 11, and the second resilient member 52 is positioned between the side wall of the groove 11 and the protective mechanism 3, the second guide post 51 is used for supporting the second resilient member 52 to prevent the second resilient member 52 from tilting, bending or shifting, and the movable base 31 is limited in the groove 11, thus improving the protection effect of the protective mechanism 3 for the module 2, and preventing the movable base 31 from falling out of the groove 11.

Specifically, the first resilient member 42 and the second resilient member 52 are both springs.

Specifically, the diameter of the first resilient member 42 is slightly larger than that of the first guide post 41, and the diameter of the second resilient member 52 is slightly larger than that of the second guide post 51, so that the first resilient member 42 and the second resilient member 52 can freely expand and contract.

In one embodiment, the first guide post 41 is arranged in the vertical direction.

In one embodiment, the first guide post 41 and the second guide post 51 are perpendicular to each other.

Alternatively, both the first guide post 41 and the second guide post 51 are contractible, the first guide post 41 can abut against the corner armor 32 or the movable base 31, and the second guide post 51 can abut against the side wall of the groove 11 or the protective mechanism 3.

Alternatively, the first resilient member 42 is fixedly connected to the corner armor 32 and the movable base 31, respectively, and the second resilient member 52 is fixedly connected to the inner wall of the groove 11 and the protective mechanism 3, respectively.

In one embodiment, referring to FIGS. 4 to 6, the first guide post 41 is fixed to the corner armor 32, the movable base 31 is provided with a first guide hole 311, the first guide post 41 can extend into the first guide hole 311. When reset, pressing down the corner armor 32, the first guide post 41 can extend into the first guide hole 311 to provide a press-down space for the corner armor 32, so as to avoid that the corner armor 32 cannot be normally pressed down due to the first guide post 41 pushing against the movable base 31, the structure is simple, and the operation is convenient;

The second guide post 51 is fixed on the protective mechanism 3, the box body 1 is provided with a second guide hole 12, the second guide post 51 can extend into the second guide hole 12. When reset, pushing inward the protective mechanism 3, the second guide post 51 can extend into the second guide hole 12, providing a moving space for the protective mechanism 3 to move toward the groove 11, so as to avoid that the protective mechanism 3 cannot move toward the groove 11 due to the second guide post 51 pushing against the side wall of the groove 11, the structure is simple, and the operation is convenient.

Alternatively, when the protective mechanism 3 is turned on, the first guide post 41 is located outside the first guide hole 311; when the protective mechanism 3 is reset, the first guide post 41 extends into the first guide hole 311.

Alternatively, after the protective mechanism 3 is turned on, the second guide post 51 is located outside the second guide hole 12; after the protective mechanism 3 is reset, the second guide post 51 extends into the second guide hole 12.

In one embodiment, referring to FIG. 4, the second guide post 51 is fixed on the movable base 31 to prevent the second guide post 51 from interfering with the movement of other mechanisms and to facilitate the fixing of the second guide post 51.

In one embodiment, referring to FIGS. 4 and 5, when the protective mechanism 3 is turned on, the distance between the second guide post 51 and the second guide hole 12 is L, and the length of the second resilient member 52 is 1, L<1. The second resilient member 52 is limited to a position between the protective mechanism 3 and the second guide hole 12, to prevent the second resilient member 52 from falling off between the protective mechanism 3 and the second guide hole 12.

In one embodiment, referring to FIG. 5, both ends of the first resilient member 42 press against the corner armor 32 and the movable base 31 respectively. Both ends of the second resilient member 52 press against the side wall of groove 11 and the protective mechanism 3, respectively. When the protective mechanism 3 is turned on, the first resilient member 42 can elastically press against the corner armor 32 and prevent the corner armor 32 from moving downward, so as to press the lower part of the corner armor 32 against the upper wall of the groove 11 and improve the protective stability of the corner armor 32 for module 2; The second resilient member 52 can elastically press the protective mechanism 3 and prevent the protective mechanism 3 from moving toward the groove 11, so as to improve the stability of the protective mechanism 3.

In one embodiment, referring to FIGS. 5 and 6, the end of the first guide post 41 away from the corner armor 32 is located in the first guide hole 311, which ensures that the first resilient member 42 does not bend when the protective mechanism 3 is turned on or reset, and prevents displacement between the corner armor 32 and the movable base 31 in a direction perpendicular to the first guide post 41. The end of the second guide post 51 away from the protective mechanism 3 is located in the second guide hole 12, to facilitate guiding the second resilient member 52 to ensure that the second resilient member 52 does not bend when the protective mechanism 3 is turned on or reset, and prevent displacement of the protective mechanism 3 in a direction perpendicular to the second guide post 51 in the groove 11.

In one embodiment, referring to FIG. 4, it further includes a mounting base 7 fixed in the groove 11, the mounting base 7 is provided with a chute 71, the protective mechanism 3 is provided with a sliding block 312, and the sliding block 312 is slidably arranged in the chute 71, to facilitate sliding of protective mechanism 3 on mounting base 7.

In one embodiment, the chute 71 is disposed on the lower wall of the mounting base 7, and the sliding block 312 is disposed on the lower end of the movable base 31.

Optionally, the chute 71 is disposed on the lower wall of the groove 11.

In one embodiment, chute 71 extends along an angular bisector between two adjacent edges of the box body 1, to facilitate sliding of protective mechanism 3 so that corner armor 32 can better protect module 2.

In one embodiment, the mounting base 7 is fixed to the side wall of the groove 11 by screws, and the mounting base 7 is located in the groove 11.

In one embodiment, referring to FIGS. 4 and 5, the protective mechanism 3 further includes at least one third guide post 33 fixed to the movable base 31 or the corner armor 32. At least one third guide hole is arranged on the corner armor 32 or the movable base 31, the third guide post 33 extends into the third guide hole, and the third guide posts 33 correspond one-to-one to the third guide holes, and the third guide post 33 functions to guide the corner armor 32, so that the corner armor 32 stably moves along the axial direction of the third guide post 33, to avoid that the corner armor 32 is skewed, misplaced or detached from the third guide post 33 when the module 2 is protected by the corner armor 32.

In one embodiment, two third guide posts 33 are provided.

In one embodiment, referring to FIGS. 5 and 6, the third guide post 33 is fixed to the movable base 31.

A fixed plate 321 is extended inward at the lower end of the corner armor 32, the fixed plate 321 can abut against the upper wall of the groove 11, the fixed plate 321 is provided with a through hole, and a third guide post 33 passes through the through hole to facilitate the corner armor 32 to slide on the third guide post 33, so as to press down the corner armor 32 and push the protective mechanism 3 into the groove 11, thereby improving the sliding stability of the corner armor 32, the structure is simple, and the operation is convenient. Furthermore, the fixed plate 321 can improve the protection effect of the corner armor 32 for the module 2, the fixed plate 321 can avoid the corner armor 32 from detaching from the box body 1, and prevent the corner armor 32 from detaching from the third guide post 33.

Optionally, a fixing member is provided on the portion of the third guide post 33 passing through the fixed plate 321, to prevent the corner armor 32 from sliding out of the third guide post 33.

In one embodiment, referring to FIG. 6, the limit member 6 is disposed on box body 1 and can expand and contract.

When the protective mechanism 3 is turned on, the protective mechanism 3 can press the limit member 6 into the box body 1, so that the protective mechanism 3 can continue sliding outward the groove 11, until the corner armor 32 covers the corner of the module 2.

When the protective mechanism 3 is reset, the limit member 6 extends out and can abut against the outer side of the protective mechanism 3, to prevent the protective mechanism 3 from sliding out of the groove 11. The limit member 6 abuts the protective mechanism 3 in the groove 11 by using the flexibility of limit member 6, to realize simple structure and convenient operation when the limit member 6 limits the protective mechanism 3.

In one embodiment, referring to FIG. 6, the abutting end between limit member 6 and protective mechanism 3 is a cone, the protective mechanism 3 can slide on the cone of limit member 6, providing the limit member 6 with a downward force and gradually pressing limit member 6 into box body 1.

In one embodiment, after the protective mechanism 3 is turned on, the limit member 6 abuts against the inner side of the protective mechanism 3 to limit the protective mechanism 3 to move inward, improving the stability of the protective mechanism 3 after turned on, and preventing the protective mechanism 3 from detaching from the box body.

In one embodiment, referring to FIG. 6, the limit member 6 includes a first bump stop 61 and a second bump stop 62, the first bump stop 61 is arranged on the lower wall of groove 11, and the second bump stop 62 is arranged on the upper wall of groove 11, to facilitate limiting the corner armor 32 and the movable base 31 respectively, so as to limit the upper and lower ends of the protective mechanism 3 and improve the stability of the protective mechanism 3.

Specifically, the limit member 6 is located at the end of chute 71 near the exterior side.

Specifically, the limit member 6 is a marble that shrinks into box body 1 when pressed, and ejects the bottom wall of groove 11 when not pressed.

In one embodiment, referring to FIG. 4, when the protective mechanism 3 is turned on, the corner armor 32 protrudes from the upper part of the module 2, so as to protect the module 2 more thoroughly and prevent the module 2 from being damaged due to contact between the upper surface of the module 2 and external objects. Furthermore, when the LED display screen drops and the side provided with the module 2 faces downward, the corner armor 32 will first fall to the ground and gradually be squeezed until flush with the upper surface of the module, so when the protective mechanism 3 is turned on, the corner armor 32 further has a buffering effect.

The specific steps for turning on the protective mechanism 3 are as follows:

First, the movable base 31 is artificially given an inward force, so that the protective mechanism 3 moves inward the groove 11 as a whole, the second resilient member 52 contracts and has a larger potential energy. Then, the thrust force is quickly withdrawn. At this time, the protective mechanism 3 moves outward the groove 11 under the push of the second resilient member 52 because there is no external force restriction. The protective mechanism 3 has greater kinetic energy under the push of the second resilient member 52. Therefore, when the movable base 31 passes through the limit member 6, the movable base 31 will press the resilient member into the bottom wall of the groove 11 and continue to move outward until the corner armor 32 is no longer in contact with the upper wall of the groove 11 of the module 2. At this time, the first resilient member 42 pushes the corner armor 32 upward until the potential energy of the first resilient member 42 is completely released, and the corner of the module 2 can be covered by the corner armor 32, so as to protect the module 2.

The specific steps for resetting the protective mechanism 3 are as follows:

Press the corner armor 32 downward, the first resilient member 42 contracts until the corner armor 32 can abut against the upper wall of groove 11, then push the protective mechanism 3 into groove 11 until the limit member 6 is located outside the movable base 31, and the movable base 31 can be abutted and limited in the groove 11, then stop pressing, the reset operation is completed.

Optionally, when the protective mechanism 3 is turned on, the limit member 6 can be directly pressed down, so that the protective mechanism 3 can move outward the groove 11 under the push of the second resilient member 52.

The above descriptions are only preferred embodiments of the present application, and are not intended to limit the application. Any modification, equivalent substitution and improvement made within the spirit and principles of the application shall be included in the scope of protection of the application.

What is claimed is:

1. An anti-impact LED display screen, comprising a box body and a module fixed on the box body, characterized by further comprising: a protective mechanism, a first resilient assembly, a second resilient assembly and a limit member; the protective mechanism comprises a movable base and a corner armor; the corner of the box body is provided with a groove for accommodating the protective mechanism, and the first resilient assembly is arranged between the corner armor and the movable base; the second residual assembly is arranged between the side wall of the groove and the protective mechanism;

when the protective mechanism is turned on, the second resilient assembly pushes the protective mechanism to move outward of the groove, the first resilient assembly pushes the corner armor out of the groove, and the corner armor covers the corner of the module;

when the protective mechanism is reset, the upper end of the corner armor abuts against the upper wall of the groove, the corner armor compresses the first resilient assembly, the protective mechanism compresses the second resilient assembly, and the limit member limits the protective mechanism within the groove.

2. The anti-impact LED display screen according to claim 1, wherein when the limit member stops the protective mechanism in the groove, applying an external force to compress the second resilient assembly can move the protective mechanism toward the groove.

3. The anti-impact LED display screen according to claim 1, wherein the first resilient assembly comprises a first guide post and a first resilient member sleeved on the first guide post, one end of the first guide post is fixed on the corner armor or the movable base, the lower part of the corner armor is limited to a position between the upper end of the movable base and the upper wall of the groove, and the first resilient member is positioned between the corner armor and the movable base;

the second resilient assembly comprises a second guide post and a second resilient member sleeved on the second guide post, one end of the second guide post is fixed on the protective mechanism or the inner groove wall, the movable base is limited within the groove, and the second resilient member is positioned between the side wall of the groove and the protective mechanism.

4. The anti-impact LED display screen according to claim 3, wherein the first guide post is fixed on the corner armor, the movable base is provided with a first guide hole, and the first guide post can extend into the first guide hole;

the second guide post is fixed on the protective mechanism, the box body is provided with a second guide hole, and the second guide post can extend into the second guide hole.

5. The anti-impact LED display screen according to claim 4, wherein when the protective mechanism is turned on, the distance between the second guide post and the second guide hole is l, and the original length of the second resilient member is 1, l<1.

6. The anti-impact LED display screen according to claim 4, wherein both ends of the first resilient member are respectively pressed against the corner armor and the movable base;

both ends of the second resilient member are respectively pressed against the side wall of the groove and the protective mechanism.

7. The anti-impact LED display screen according to claim 4, wherein the end of the first guide post away from the corner armor is located in the first guide hole;

the end of the second guide post away from the protective mechanism is located in the second guide hole.

8. The anti-impact LED display screen according to claim 1, characterized by further comprising a mounting base, wherein the mounting base is fixed in the groove, a chute is arranged on the mounting base, a sliding block is arranged on the protective mechanism, and the sliding block is slidably arranged in the chute.

9. The anti-impact LED display screen according to claim 1, wherein the protective mechanism further comprises at least a third guide post, the third guide post is fixed on the movable base or the corner armor; at least one third guide hole is arranged on the corner armor or the movable base, the third guide post extends into the third guide hole, and the third guide posts correspond one-to-one to the third guide holes.

10. The anti-impact LED display screen according to claim 9, wherein the third guide post is fixed on the movable base;
    the lower end of the corner armor extends inwards and has a fixed plate, the fixed plate can abut against the upper wall of the groove, the fixed plate is provided with a through hole, and the third guide post passes through the through hole.

11. The anti-impact LED display screen according to claim 1, wherein the limit member is arranged on the box body and telescopic;
    when the protective mechanism is turned on, the protective mechanism can press the limit member into the box body;
    when the protective mechanism is reset, the limit member extends out and can abut against the outer side of the protective mechanism.

12. The anti-impact LED display screen according to claim 11, wherein the abutting end between the limit member and the protective mechanism is a cone.

13. The anti-impact LED display screen according to claim 11, wherein after the protective mechanism is turned on, the limit member abuts against the inner side of the protective mechanism.

14. The anti-wherein LED display screen according to claim 11, wherein the limit member comprises a first bump stop and a second bump stop, the first bump stop is arranged on the lower wall of the groove, and the second bump stop is arranged on the upper wall of the groove.

15. The anti-impact LED display screen according to claim 1, wherein when the protective mechanism is turned on, the corner armor protrudes from the upper part of the module.

* * * * *